United States Patent
Downes, Jr. et al.

(10) Patent No.: US 6,626,196 B2
(45) Date of Patent: Sep. 30, 2003

(54) ARRANGEMENT AND METHOD FOR DEGASSING SMALL-HIGH ASPECT RATIO DRILLED HOLES PRIOR TO WET CHEMICAL PROCESSING

(75) Inventors: Francis J. Downes, Jr., Vestal, NY (US); Raymond T. Galasco, Vestal, NY (US); Lawrence P. Lehman, Endicott, NY (US); Robert D. Topa, Binghamton, NY (US)

(73) Assignee: International Busines Machines Corporation, Armonk, NY (US)

( * ) Notice: Subject to any disclaimer, the term of this patent is extended or adjusted under 35 U.S.C. 154(b) by 169 days.

(21) Appl. No.: 09/882,235

(22) Filed: Jun. 15, 2001

(65) Prior Publication Data

US 2002/0189637 A1 Dec. 19, 2002

(51) Int. Cl.[7] .................................................. B08B 3/12
(52) U.S. Cl. ...................... 134/184; 134/111; 134/198; 134/199; 134/902; 134/780; 95/241; 95/243; 95/260; 438/906
(58) Field of Search ................................ 134/784, 111, 134/198, 199, 786, 902; 95/241, 243, 260; 438/906

(56) References Cited

U.S. PATENT DOCUMENTS

| | | |
|---|---|---|
| 4,865,060 A | 9/1989 | Shibano |
| 4,907,611 A | 3/1990 | Shibano |
| 5,368,634 A | 11/1994 | Hackett |
| 5,383,483 A * | 1/1995 | Shibano ...................... 134/111 |
| 5,653,860 A | 8/1997 | Nicholls et al. |
| 5,810,037 A | 9/1998 | Sasaki et al. |
| 5,834,625 A | 11/1998 | Kraus, Jr. et al. |
| 6,001,189 A * | 12/1999 | Rolfson ........................ 134/10 |
| 6,039,814 A | 3/2000 | Ohmi et al. |
| 6,042,635 A | 3/2000 | Chung et al. |
| 6,071,385 A | 6/2000 | Long |
| 6,210,470 B1 | 4/2001 | Philips et al. |

FOREIGN PATENT DOCUMENTS

| | | |
|---|---|---|
| JP | 1194388 | 8/1989 |
| JP | 1263300 | 10/1989 |
| JP | 3248494 | 11/1991 |
| JP | 4-70550 * | 3/1992 |
| JP | 4154192 | 5/1992 |
| JP | 4-208595 * | 7/1992 |
| JP | 5211384 | 8/1993 |
| JP | 7323862 | 12/1995 |
| JP | 9-69506 * | 3/1997 |
| JP | 10-056261 | 2/1998 |

* cited by examiner

Primary Examiner—Randy Gulakowski
Assistant Examiner—M. Kornakov
(74) Attorney, Agent, or Firm—Scully, Scott, Murphy & Presser; Arthur J. Samodovitz, Esq.

(57) ABSTRACT

An arrangement and method for the degassing small high-aspect ratio drilled holes or vias which are present in panels such as printed circuit boards prior to wet chemical processing, including copper plating of the vias, in order to remove any air or gas bubbles from the vias tending to inhibit the reliable plating thereof. This is carried out through the utilization of an ultrasonic prewetting in a liquid bath preceding cleaning for the electroless plating process, thereby enabling all of the vias or holes to be degassed; in effect, having air removed and the vias or holes filled with liquid; thereby allowing subsequent process cleansing solutions to easily flow into the respective holes or vias in order to facilitate the electroless copper plating process.

17 Claims, 1 Drawing Sheet

Figure 1:
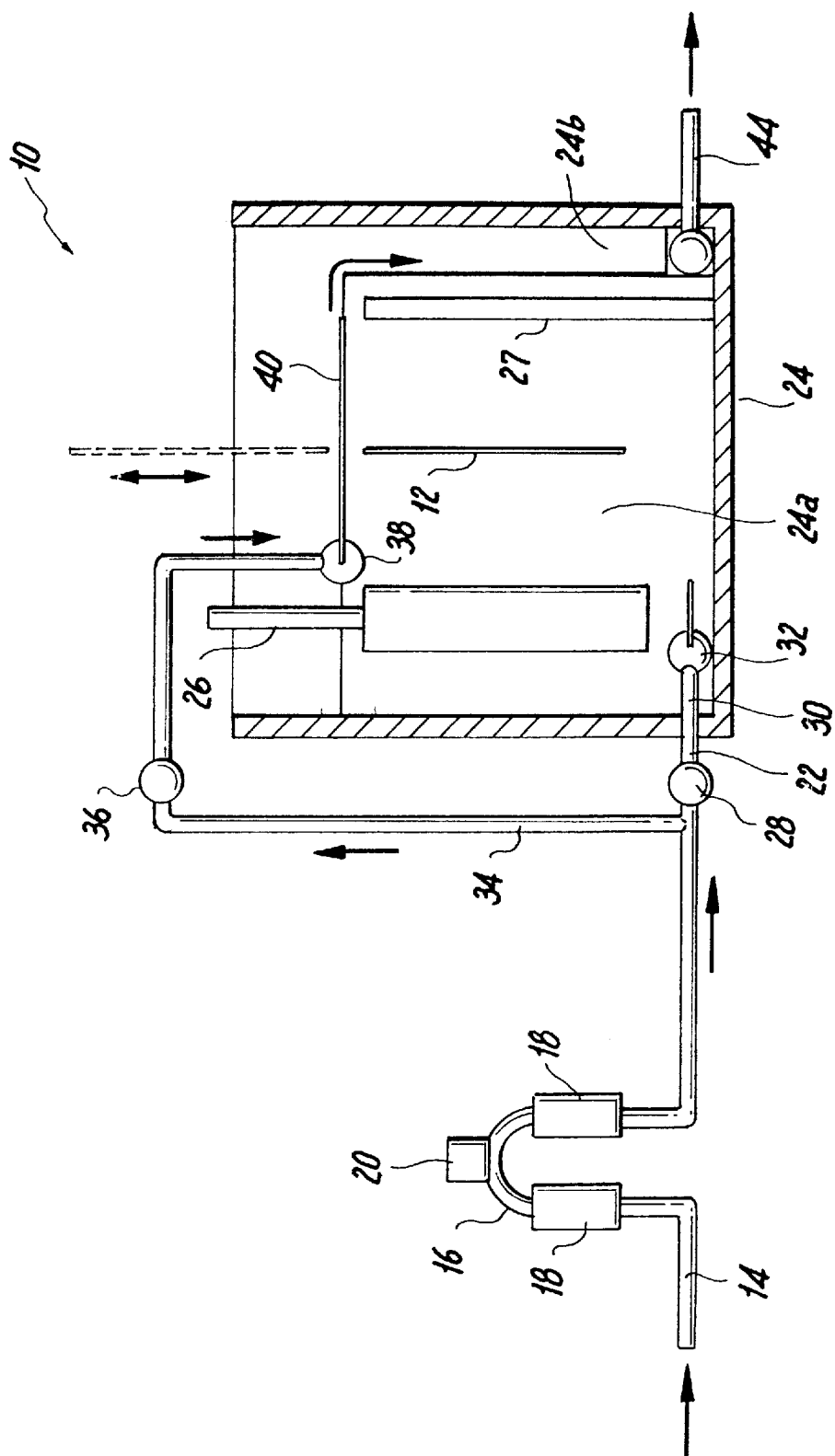

ARRANGEMENT AND METHOD FOR DEGASSING SMALL-HIGH ASPECT RATIO DRILLED HOLES PRIOR TO WET CHEMICAL PROCESSING

BACKGROUND OF THE INVENTION

1. Field of the Invention

The present invention relates to an arrangement for the degassing small high-aspect ratio drilled holes or vias which are present in panels prior to wet chemical processing of the panels. Moreover, more particularly, the present invention is directed to the degassing of vias which are formed in printed circuit boards prior to the copper plating of the vias in order to remove any air or gas bubbles from the vias tending to inhibit the reliable plating thereof. In addition to the foregoing, the invention is also directed to a method for implementing the degassing of the small high-aspect ratio drilled holes which are provided in the panels or printed circuit boards prior to the wet chemical processing of the latter, such as the copper plating of the surface areas of the drilled holes or vias.

In the technology directed to the manufacture of electronic packages, especially modules comprising semiconductor devices and printed circuit boards, the modules are frequently provided with considerable numbers of vias or holes, ranging up to 2000 to 3000 in numbers, which are frequently required to have their surfaces copper plated, to produce PTH's (plated through holes). In attempting to implement the copper plating of such small diameter holes or vias, which normally each possess diameters within a range of about 0.001 to 0.002 inches at high aspect ratios of 6–8:1, difficulties are at times encountered in being able to satisfactorily completely wet or plate the inside of the holes due to the occluding presence of air or gas bubbles. Consequently, in the event that even if a single hole is not adequately copper-plated, then the entire apertured module comprising of the printed circuit board must be discarded, and resultingly leading to considerable economic losses. With respect to the foregoing, it is of extreme importance to be able to provide an adequate wetting of the holes or vias which are present in the printed circuit boards or modules prior to the effectuating of an electroless copper plating pre-cleaning process step, in order to ensure that all of the interior surfaces of the vias or holes are adequately prepared for the electroless copper plating process. This, in effect, would then prevent any potential internal separation phenomena to occur due to a lack of adequate pre-cleaning of the inner planes of the copper material which being applied to the surfaces areas the vias or holes, inasmuch as, if any air or air bubbles were to remain in the holes during the electroless plating process step, the copper plating would fail to fully deposit on the via or hole surfaces, thereby resulting in internal plating separation causing an open circuit and potential failure of the electronic product being equipped with the specific printed circuit board or module.

Basically, in order to implement the removal of gasses or air bubbles from a liquid bath environment which is employed in the processing of articles, for example, such as modules comprising printed circuit boards incorporating a multiplicity of holes or vias which are to be copper plated in an electroless copper plating process, it is imperative that a suitable degassing step is implemented. This may be preferably carried out through the utilization of an ultrasonic prewetting in a deionized water or other suitable liquid bath preceding cleaning for the electroless plating process, thereby enabling all of the vias or holes to be degassed; in effect, having air removed and the vias or holes filled with liquid; thereby allowing subsequent process cleansing solutions to easily flow into the respective holes or vias in order to facilitate the electroless copper plating process.

In order to implement the comprehensive degassing of the liquids; in effect, the removal of any occluded air or gas bubbles, specific physical conditions must be satisfactorily met. Firstly, the liquid in the bath which is utilized in order to initially prewet the modules or panels containing the vias or small holes, and with the bath being constituted of either deionized water or other suitable liquids, must be fully degassed, preferably through the application of ultrasonic energy or any other process in which normal levels of dissolved air entrained in the liquid within the tank and/or entering the tank must be depleted and removed therefrom. Secondly, the apertured modular panels or printed circuit boards within the tank must be exposed to ultrasonic energy in order to promote the displacement and/or the dissolution of air or gas bubbles from the small holes or vias. In essence, failure to employ both of the foregoing conditions would result in the process being ineffective for adequately prewetting all of the small-diameter high-aspect ratio holes or vias, although potentially for small diameter holes or vias with small aspect ratios, agitation in a fully degassed tank (without ultrasonic energy) may be sufficient to dissolve and eliminate all of the air bubbles which are present in the bath or liquid.

2. Discussion of the Prior Art

Although numerous processes have been developed in various technologies which are directed to the degassing of liquids utilized in the cleaning of articles of the most diverse types, these have not been found to be fully satisfactorily, although complex systems utilize ultrasonic vibrators and energy generators in order to degass the liquids.

Sasaki et al. U.S. Pat. No. 5,810,037 discloses an ultrasonic treatment apparatus for articles immersed in a cleaning liquid which are subjected to a cavitation phenomenon caused by an ultrasonic vibrator. The cleaning liquid is then conveyed to a degassing vessel and thereafter re-circulated to the cleaning vessel subsequent to gas being dissolved in the degassing vessel and the bubbles separated out and maintained in a vacuum.

Philips, et al. U.S. Pat. No. 6,210,470 discloses an ultrasonic gas separator wherein gas bubbles in a moving fluid is collected in a chamber arranged adjacent a conduit conveying the fluid. An ultrasonic transducer is adapted to cooperate with a reflector to create a particular ultrasonic wave pattern so as to remove gas bubbles and enable these to be collected exteriorly of the flow of the fluid.

Long U.S. Pat. No. 6,071,385 discloses a racking fixture for electrochemical processing wherein gases trapped in components are adapted to be removed through suitable ultrasonic applications.

Chung, et al. U.S. Pat. No. 6,042,635 discloses a method for wetting a filter element, and wherein a vibration device will cause pressurized liquid to have entrained air bubbles in a filter element to be separated therein from a liquid and exhausted from the system.

Ohmi et al. U.S. Pat. No. 6,039,814 discloses a cleaning method employing a degassed cleaning liquid with applied ultrasonics, whereby particular ultrasonic frequencies are utilized to remove air bubbles through the intermediary of water vapor from a degassing device containing a liquid.

Kraus Jr. et al. U.S. Pat. No. 5,834,625 discloses an apparatus and a method for debubbling a discrete sample of a liquid through the intermediary of an ultrasonic device which causes air or gas bubbles to be exhausted from essentially high viscous liquids through the formation of ultrasonic waves.

Nicholls, et al. U.S. Pat. No. 5,653,860 discloses a system for the ultrasonic removal of air bubbles from the surface of an electroplated article, and wherein the mechanical vibrations produced by the ultrasonic transducer results in vibrations removing air bubbles and gases from the article surfaces.

Hackett U.S. Pat. No. 5,368,364 discloses a system for removing bubbles from small cavities consisting of blind via holes in a semiconductor wafer by immersing the article and cavities in a liquid medium. The bubbles are enabled to flow freely to enable the processing within the cavities to commence in a suitable degassed liquid.

Shibano, U.S. Pat. Nos. 4,907,611 and 4,865,060 each disclose ultrasonic washing apparatuses whereby air bubbles are removed from a liquid washing specific articles through the intermediary of an ultrasonic vibrator causing the radiation of ultrasonic waves into a washing bath, and enabling the cavitation resulting therefrom to remove soil from soiled articles located in the washing bath.

Japanese Patent JP 11 94 388 discloses a metal plating apparatus which incorporates a vibration generator to enable air entrapped in a plating liquid to be removed therefrom Furthermore, various Japanese publications, including Japanese Patent Publication 10-056261; Japanese Patent JP 73 26 862; Japanese Patent JP 52 1 384; Japanese Patent J 32 48 494; Japanese Patent JP 12 63 300; and Japanese Patent JP 41 54 192, are directed to various aspects of removing entrained or occluded gas or air bubbles from liquids which are employed in the processing of various articles, such as modules or panels including semiconductor devices, printed circuit boards and the like.

Although the foregoing patent publications each describe various types of arrangements, systems and methods for implementing the degassing of liquids, which through suitable applications may be employed for the pre-wetting of articles and any vias or holes formed therein so as to facilitate further wet chemical processing thereof, such as electroless copper plating or the like among other processes, none of these fulfill the above-mentioned conditions in being able to ensure, in a completely satisfactory manner, the pre-treatment of small diameter holes or vias possessing high aspect ratios to provide for the non-problematic subsequent wet chemical processing, such as copper plating. The intent is to produce desired high quality semiconductor devices comprising modules with printed circuit boards each incorporating a large number of small diameter holes or vias. In particular, a review of the current state-of-the technology, particularly as represented by the prior art, indicates that the pre-wetting or cleaning actions are primarily implemented in vessels wherein these contain the liquids in a generally stagnant or static environment, which frequently may be inadequate to fully remove entrapped air or gas bubbles from the modules, and particularly from internally of the small-diameter high-aspect ratio holes or vias which are present in such semiconductor devices or modules in the form of printed circuit board panels.

In order to clearly be able to fully utilize the ultrasonic energy, the application of which to the cleaning of articles or components is well known and developed in the technology, the use thereof in a highly reliable manner in order to eliminate entrapped gas or air from vias or holes in a separate manufacturing process is unique, and in order to achieve a high degree of reliability it is necessary to specify the required conditions at which the process becomes most effective.

SUMMARY OF THE INVENTION

Accordingly, the present invention utilizes a novel concept in the form of an in-line degassing arrangement forming an aperture system in which a prewet tank into which the modules or printed circuit boards containing the numerous small high aspect ratio drilled holes or vias are inserted, are degassed through the intermediary of a continuously flowing liquid, such as but not limited to deionized and essentially degassed water rather than the stagnant or static bath tanks which are presently employed in the technology.

The continuous water exchange and flow of the liquid employed by the inventive arrangement not only eliminate the air and gas bubbles from the surfaces of the modules and the vias which are formed therein, but also carries off any contaminates and particulates which are freed from the panel and the via surfaces by means of ultrasonic energy or mechanical vibratory action, thus imparting a further cleaning function to the pre-wetting process. This, in effect, will prevent any drying or dewetting of the articles prior to subsequent electroless copper plating, through which a so-called "t" could be encountered at the walls of the vias, resulting in a lack of adequate copper plating thickness and presenting a potential reliability problem in the use of electronic packages having the printed circuit boards or modules installed therein.

The inventive arrangement and process depends upon a dissolution of bubbles into the gas-depleted liquid flow of the bath, wherein the generated ultrasonic energy field due to the action of ultrasonic transducers serves primarily to promote acoustic microstreaming within the vias, thus shorting the path of diffusion of the air in the liquid by virtue of circulation. The ultrasonic field which is produced also serves to maintain the degassed condition of the bath into which there are immersed the modules, such as the printed circuit board panels incorporate the vias, over the course of time, wherein maintaining the degassed condition of the liquid in the tank is actually of greater significance than a direct application of ultrasonic energy to the panels.

Although so-called panel bumping and panel tilting have been employed in the technology in order to remove air from drilled holes prior to and/or during the plating processes, this maybe somewhat effective for larger-sized holes or vias, but remains essentially ineffective for smaller holes or vias, particularly those possessing high-aspect ratios.

Pursuant to the invention, there is thus provided an in-line, continuous flow pre-wetting process wherein the liquid is degassed prior to entering the pre-wetting tank having the panels immersed in a water bath, such as deionized water, liquid/surfactant, caustic solution or the like, and wherein prior to entering the prewetting tank an ultrasonic degassing unit or units will eliminate air or gas bubbles from the incoming flow of liquid.

The degassed liquid is then conducted into a bath tank containing one or more panels, such as printed circuit boards, and a surface spray may also be employed in spraying the upper surface of the bath liquid with the degassed liquid to flush surface impurities.

An ultrasonic transmitter array may be provided to face the panel or panels in the tank, and enables the freeing and removal of other contaminants and residual amounts of air from the surfaces and vias hereof, whereas a drain facilitates the continuous flow of the treatment liquid from the tank responsive to an overflow of liquid.

Accordingly, it is an object of the present invention to provide a novel arrangement for the degassing of small high-aspect ratio drilled holes or vias in panel structures prior to any wet chemical processing of the latter.

Another object of the present invention is to provide an arrangement for the degassing of modules comprising panels each incorporating a plurality of small holes or vias through the intermediary of suitably degassed liquid and continuous circulation of the liquid through a bath tank in which the panels are immersed.

Yet another object of the present invention resides in the provision of an arrangement of the type described wherein the degassing of the panels containing the small sized vias or holes prior to wet chemical processing thereof is implemented through the intermediary of ultrasonic energy in a continuous manner inhibiting the de-wetting of the via or holes which have been previously wetted in a capillary-like manner.

A further object of the present invention is to provide a method for the degassing of small high-aspect ratio drilled holes or vias in panel structures, such as printed circuit boards prior to wet chemical processing thereof.

BRIEF DESCRIPTION OF THE ACCOMPANYING DRAWING

Reference may now be made to the following detailed description of a preferred embodiment of an arrangement for the degassing of modular panels having vias formed therein, in a flowing bath of degassed liquid trough the intermediary of ultrasonic energy employing the arrangement as described herein, having reference to the accompanying single FIG. 1 of a drawing illustrative of a diagrammatic representation of the degassing arrangement.

DETAILED DESCRIPTION OF A PREFERRED EMBODIMENTS

Referring now specifically to the single FIG. 1 of drawing, there is generally diagrammatically disclosed a degassing arrangement 10 for the pre-wetting treatment of articles prior to a contemplated wet chemical processing thereof. In particular, in this instance, the articles which are to be pre-wetted in a liquid bath, comprise modular panels consisting of printed circuit boards 12 each containing a multiplicity of vias or through-holes of small high aspect ratio drilled diameters, each preferably 0.001 to 0.002 inches in diameter, with high aspect ratios ranging between 6–8:1; although other sizes of diameters and aspect ratios are equally applicable to be treated by the inventive degassing method.

The arrangement 10 includes a conduit 14 for incoming liquid, such as deionized water, liquid/surfactants, caustic solutions or the like, including a loop portion 16 having one or more ultrasonic degassing units 18 installed in-line therewith. The upper end of the loop portion 16 is equipped with an automatic relief valve 20 to enable the venting to atmosphere of entrapped air or gas bubbles which has been liberated from the liquid flowing through the conduit 14 from a liquid supply source (not shown).

Connected to an outlet or discharge end portion 22 of the conduit 14 containing the degassed liquid, downstream of the inline ultrasonic degassing units 18 is a prewetting bath tank 24 which incorporates, as illustrated in a vertical orientation, all ultrasonic energy sender array 26. The tank 24 includes a large-sized open top camber section 24a providing the bath which is separated from a smaller liquid overflow chamber section 24b through the interposition of an upstanding separator wall or weir 27.

The outlet end portion 22 of the conduit 14 containing the flow of degassed liquid incorporates a first flow control valve 28, and a connection 30 to a bottom inlet 32 leading to chamber section 24a of the tank 24 beneath the position of one or more panels or modules comprising the printed circuit boards 12 in the tank. A branch or bypass conduit 34 having flow control valve 36 interposed therein, and which branches from conduit 14 upstream of valve 28, extends upwardly and terminates in a spray unit 38 at the upper surface 40 of the tank chamber section 24. The spray unit is adapted to impart a spray of the liquid unto the upper surface of the liquid flowing into the tank chamber section 24a so as to cause an overflow of liquid carrying surface impurities and contaminates to flow over the upper end of weir 27 and discharge into chamber section 24b.

A drain 44 which is connected to the bottom of tank chamber section 24b of the tank 24 enables the continuous flow and discharge of bath liquid from the tank 24. It is also possible to contemplate that the discharged liquid may be filtered, treated and recirculated to the incoming liquid conduit 14.

Although the drawing illustrates the ultrasonic energy sender array 26 in a vertical orientation, it is possible that the ultrasonic sender can be located in a horizontal position at the bottom portion of the bath tank 24. This will facilitate the use of a conveyor transported inline horizontal processing system in the treatment of the panels or modular components in the bath tank, with such panels being transported above the bottom-positioned ultrasonic sender 26

Method of Operation of the Degassing Arrangement

In implementing the degassing operation, a continuous flow of a degassed liquid, for example, such as deionized, liquid/surfactant, water is conducted from conduit 14 through the bottom inlet 32 and through the surface spray discharge end 28 into the chamber section 24a of prewetting tank 24 which contains the panel or panels consisting of the printed circuit boards 12 having the multiplicity of vias extending therethrough. The ultrasonic sender array 26 imparts ultrasonic energy to the panels, thereby removing any further entrained residual air or gas bubbles from the vias or holes therein, while concurrently freeing or loosening any contaminants from the surfaces of the panels, whereby such contaminants may be readily discharged with liquid over weir 27 into chamber section 24b and then through the drain 44.

Upon completion of the prewetting process, which maybe a first step preceding an electroless copper plating or pre-cleaning process sequence, the panels may be conveyed to a subsequent process tank (not shown) whereby typical tank-to-tank transfers may entail a period of time of 1 to 2 minutes. Within this time frame, it would be rather difficult to dewet the already wetted vias or holes which have a capillary-like wetted surfaces preparing these for subsequent cleaning and electroless copper plating.

From the foregoing, it becomes readily apparent that the continuous flow of the degassed liquid through the prewetting tank 24 containing the panel or panels 12 and the subjecting of the latter to ultrasonic cleaning action will provide for a superior and essentially highly reliable pre-cleaning of the panel surfaces and wetting of the vias or holes enabling the subsequent copper plating thereof.

In the event that the holes are small diameter sized with only small aspect ratios, rather than employing the ultrasonic sender array 26 in the prewetting tank 24, it may be adequate to simply employ mechanical vibration or agitation in the fully degassed tank 24 such as through well-known mechanical devices in order to dissolve all of the residual air bubbles remaining in the liquid or water and in the holes and allow them to discharge through the drain 44.

While the invention has been particularly shown and described with respect to a preferred embodiment thereof, it will be understood by those skilled in the art that the foregoing and other changes in form and details may be made therein without departing from the spirit and scope of the invention.

What is claimed is:

1. An arrangement for removing a gaseous medium from apertured panel members which are immersed in a liquid-filled tank prior to subjecting said panels to a wet chemical processing; said arrangement comprising:
   (a) an inlet conduit for supplying a continuous flow of said liquid to said tank, said conduit comprising a first outlet portion for discharging a portion of said liquid flow into a first chamber of said tank proximate a bottom region of said tank chamber, and a second outlet portion for discharging a further portion of said liquid flow into said first tank chamber at an upper end of said tank;
   (b) at least one degassing means in said conduit upstream of said outlet portions for eliminating said gaseous medium entrained in said liquid flow;
   (c) vibratory means in said tank operative to energetically remove residual gaseous medium from said panels and apertures; and
   (d) a liquid outlet chamber communicating with said first chamber at the upper end of said tank, said outlet chamber communicating with a drain so as to facilitate a continuous circulation of said liquid through and from said tank to thereby eliminate any gaseous medium from said panels and apertures, wherein said at least one degassing means comprises an inline ultrasonic unit in said inlet conduit.

2. An arrangement as claimed in claim 1, wherein said inlet conduit has an upwardly directed loop portion, said at least one degassing means being arranged inline in said loop portion.

3. An arrangement as claimed in claim 2, wherein a relief valve is located at the apex of said loop portion so as to provide for the venting of gaseous medium eliminated from said liquid by said at least one degassing means.

4. An arrangement as claimed in claim 3, wherein two said degassing means are arranged in said loop portion, one said degassing means being located upstream and the other said degassing means downstream of said relief valve.

5. An arrangement as claimed in claim 1, wherein said vibratory means in said tank comprises an ultrasonic sender device.

6. An arrangement as claimed in claim 5, wherein at least one panel having apertures of small-sized diameter and high-aspect ratio vias being conveyed into said first chamber said ultrasonic sender device including an array of senders for transmitting vibratory energy against the surfaces of said at least one panel so as to free any contaminants from said panels and residual gaseous medium from said vias for discharge from said tank.

7. An arrangement as claimed in claim 1, wherein said second outlet portion discharges said fixer liquid flow into the upper end of said tank in the form of a liquid spray impinging against the upper surface of the liquid flowing through said first chamber so as to cause an overflow of the liquid and entrained contaminates into said outlet chamber and discharge through said drain.

8. An arrangement as claimed in claim 1, wherein said liquid is selected from the group consisting of deionized water, liquid/surfactant and caustic solutions.

9. An arrangement as claimed in claim 1, wherein flow valves are arranged in said inlet conduit for controlling the flow of liquid to said first and second outlet portions of said inlet conduit upstream of said tank.

10. An arrangement for removing a gaseous medium from modules comprising printed circuit boards each having a plurality of small-sized high-ratio holes formed therein which boards are immersed in a liquid-filled tank prior to subjecting said boards to a wet chemical processing; said arrangement comprising:
    (a) an inlet conduit for supplying a continuous flow of said water to a first chamber of said tank, said conduit comprising a first outlet portion for discharging a portion of said water flow into said tank proximate a bottom region of said first chamber, and a second outlet portion for discharging a further portion of said water flow into said tank at an upper end of said first chamber;
    (b) at least one degassing means in said conduit upstream of said outlet portions for eliminating said gaseous medium entrained in said liquid flow;
    (c) vibratory means in said tank operative to energetically remove residual gaseous medium from said boards and holes; and
    (d) a liquid outlet chamber connected to the upper end of said first chamber communicating with a drain so as to facilitate a continuous circulation of said water through and overflowing from said first chamber to thereby eliminate any gaseous medium from said boards and holes, wherein said at least one degassing means comprises an inline ultrasonic unit in said inlet conduit.

11. An arrangement as claimed in claim 10, wherein said inlet conduit has an upwardly bent loop portion, said at least one degassing means being arranged inline in said loop portion.

12. An arrangement a claimed in claim 11, wherein a relief valve is located at the apex of said loop portion so as to provide for the venting of gaseous medium removed from said liquid by said at least one degassing means.

13. An arrangement as claimed in claim 12, wherein two said degassing means are arranged in said loop portion, one said degassing means being located upstream and the other said degassing means downstream of said relief.

14. An arrangement as claimed in claim 10, wherein said vibratory means in said tank comprises an ultrasonic sender device.

15. An arrangement as claimed in claim 14, wherein at lease one said board being positioned in said tank, said ultrasonic sender device including an array of senders for transmitting vibratory energy against the surfaces of said at least one board so as to free any contaminants from said board and residual gaseous medium from said holes for discharge from said tank.

16. An arrangement as claimed in claim 10, wherein said second outlet portion discharges said further water flow into the upper end of said tank in the form of a liquid spray impinging against the upper liquid surface in said first chamber to facilitate an overflowing of liquid and entrained contaminates into said outlet chamber.

17. An arrangement as claimed in claim 10, wherein flow valves are arranged in said inlet conduit for controlling the flow of liquid to said first and second outlet portions of said inlet conduit upstream of said tank.

* * * * *